US006366022B1

(12) United States Patent
Mies et al.

(10) Patent No.: US 6,366,022 B1
(45) Date of Patent: Apr. 2, 2002

(54) ELECTRONIC BALLAST FOR STABILIZING CURRENT IN A GAS DISCHARGE LAMP AND METHOD OF MANUFACTURING SAME

(75) Inventors: Cornelis J. Mies; Bram K. G. Mader, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/575,606

(22) Filed: May 22, 2000

(30) Foreign Application Priority Data

Oct. 25, 1999 (EP) .......................................... 99203506

(51) Int. Cl.[7] .............................................. H05K 1/03

(52) U.S. Cl. ........................................ 315/56; 315/58

(58) Field of Search ............................ 315/56, 57, 58, 315/59; 362/217

(56) References Cited

U.S. PATENT DOCUMENTS

| | | | | | |
|---|---|---|---|---|---|
| 4,419,719 | A | | 12/1983 | Boer et al. | 362/218 |
| 4,916,363 | A | * | 4/1990 | Burton et al. | 315/276 |
| 5,350,316 | A | | 9/1994 | Van Wagener et al. | 439/460 |

* cited by examiner

*Primary Examiner*—David Vu

(57) ABSTRACT

The invention relates to an electronic ballast for discharge lamp, comprising a container with a wall, electronic components and at least one electroconductive element, which forms a connection between the individual electronic components and/or which can form a connection between the electronic components and the discharge lamp. According to the invention, at least a part of the conductive element extends parallel to the wall and is enclosed in the material of the wall.

18 Claims, 4 Drawing Sheets

ELECTRONIC BALLAST FOR STABILIZING CURRENT IN A GAS DISCHARGE LAMP AND METHOD OF MANUFACTURING SAME

FIELD OF THE INVENTION

BACKGROUND AND SUMMARY OF THE INVENTION

The invention relates to an electronic ballast for stabilizing current in a gas discharge lamp.

The invention relates to an electronic ballast for stabilizing the current in a gas discharge lamp, comprising a holder with a wall, electronic components and at least one electroconductive element, which forms a connection between the individual electronic components and/or which can form a connection between the electronic components and the gas discharge lamp.

Such an electronic ballast is well known. A property of gas discharge lamps is that the electric resistance of these lamps is not constant, but decreases with increasing voltage. As a result, a slight increase of the voltage causes a disproportionately large increase of the current flowing through the lamp, which is undesirable. The ballast serves to limit and stabilize the current through the lamp. The ballast may also comprise a rectifier, which converts the AC voltage supplied by the power supply into a DC voltage, and a transformer which brings the voltage to the desired level.

In the known ballast, the electroconductive elements, which generally comprise connection wires and connectors, may be provided on a main printed circuit board (also referred to as printed wiring board or PCB) which is mounted in a metal or synthetic resin holder. As such a printed circuit board takes up extra space in the ballast, the connection wires are known to be alternatively provided on a foil which is attached to the holder, in which case the connectors are secured to the holder. The electronic components, which determine the electrical properties of the ballast, are provided on this printed circuit board or foil either directly or by means circuit cards. If the holder is made of metal, care should be taken that the electronic circuitry is properly insulated with respect to the holder, which is often achieved by using insulating foil.

There is a need for smaller-sized electronic ballasts, which are generally bar-shaped. Particularly the height of said ballasts is important as they must be fitted in a luminaire. It will be clear that a main printed circuit board takes up quite some space.

Another required quality of a ballast is a good dissipation of the heat generated by the electronic components. In this respect, a main printed circuit board, on which these components are placed, has an insulating effect and adversely affects an efficient heat dissipation. If the components are placed on a foil, which foil is secured directly onto the wall, this problem is less important, but there is a risk that the heat generated causes the foil to melt or to be damaged. Besides, the wiring on the foil is thin and vulnerable.

Therefore, it is an object of the invention to provide a compactly constructed electronic ballast, which demonstrates a satisfactory heat dissipation and is less sensitive to damage.

A further, important object of the invention is to reduce the number of production steps in the manufacture of an electronic ballast for a gas discharge lamp, thereby reducing the production costs. Another object is to reduce the number of components of such a ballast, thereby further reducing the risk of defects.

To achieve this, at least a part of the conductive element which extends parallel to the wall is enclosed in the material of said wall. As a result thereof, the wall takes over at least a part of the functions of the main printed circuit board, thereby rendering said main printed circuit board at least partly redundant. By virtue thereof, the ballast can be more compactly constructed, or the space available for the electronic components on the main printed circuit board is increased, which is favorable for the electrical insulation between the components. It also leads to a reduction of the number of production steps and the number of components. Since the electronic components can be mounted on the holder, either directly or by means of printed circuit boards, the heat dissipation is improved too.

Preferably, the material of the wall comprises a synthetic resin, and, preferably, the holder is manufactured by means of injection molding, the conductive element being enclosed in the wall in the injection molding process. By virtue of such a method, the conductive elements no longer have to be separately provided, as is the case when the conductive elements are situated on a printed circuit board or a foil, so that said method saves both time and costs.

The electroconductive element further preferably comprises at least one connector by means of which said electroconductive wire and/or an electronic component can be connected with the electroconductive element. Advantageously, the connection wires and the connectors are manufactured from a single piece of metal, resulting in a sturdy construction and, at the same time, a further reduction of the number of components, thereby increasing the reliability.

The connector preferably comprises an elastically deformable clamping portion, which presses against the holder, whereby an electroconductive wire can be clamped between the clamping portion and the holder. More preferably, the clamping portion presses against the holder at an angle, with the angle included by the clamping portion and the holder, at the side where the electroconductive wire to be clamped may run, being an acute angle. The connection wires for connecting the gas discharge lamp can be readily inserted into these connectors, the clamping portion automatically being slightly lifted during said insertion operation. If a pulling force is subsequently exerted on the wire, the wire becomes clamped between the clamping portion and the holder.

Preferably, the ballast further comprises at least one plate-shaped cooling element, which is provided in or on the wall in which the electroconductive element is enclosed. As the cooling element is grounded, it more preferably also serves as an electromagnetic shield. This cooling element, which can be provided in the wall at the same time as the electroconductive elements, increase the heat-dissipation capacity and also cause the high-frequency electromagnetic interference to be reduced.

The ballast also preferably comprises a printed circuit board with electronic components, said printed circuit board extending substantially perpendicularly with respect to the wall in which the electroconductive element is enclosed. In this manner, electroconductive elements, which in turn are perpendicularly placed on this printed circuit board, can be brought into heat-conducting contact, at the location of a part of said electroconductive elements which is subject to a substantial increase in temperature during operation, with the wall which is preferably provided with cooling elements. If necessary, a heat-conducting casting mass may be provided between the components and the wall.

Preferably, the holder comprises a bottom plate, which forms the wall wherein the electroconductive element is enclosed, and a cover which is connected with said bottom plate. This enables the electronic circuitry to be readily placed in the holder, after which the cover is mounted.

Preferably, a plurality of electroconductive elements are punched from a plate of metal before they are enclosed in the wall. More preferably, at least one cooling element is simultaneously punched from said plate of metal, which cooling element is provided in or on the wall. This method of manufacturing these elements is very efficient and inexpensive.

Preferably, connectors are formed at the electroconductive element and/or the cooling element by bending parts of the punched plate portions. The connector preferably extends substantially perpendicularly from the electroconductive element. Also this method enables connectors to be manufactured very efficiently and inexpensively.

Preferably, the electroconductive elements and/or the cooling elements are fixed substantially with respect to one another between the time that they are punched and the time that they are enclosed in and/or provided on the wall. The manufacture of the components, the formation of the connectors and the enclosure in the wall are carried out in a single continuous process step, which is very efficient and cost-saving.

The invention also relates to a luminaire for a gas discharge lamp, comprising a lamp holder, connectors for connecting a gas discharge lamp and an electronic ballast as claimed in any one of the preceding claims, which ballast is connected to at least one of the connectors.

The invention further relates to a method of manufacturing an electronic ballast for stabilizing the current in a gas discharge lamp, wherein electronic components and at least one electroconductive element are placed in a holder with a wall so as to make sure that this electroconductive element forms a connection between the individual electronic components and/or is capable of forming a connection between the electronic components and the gas discharge lamp, at least a part of the electroconductive element which extends parallel to the wall being enclosed in the material of said wall.

These and other objects of the invention will be apparent from and elucidated with reference to the embodiments described hereinafter.

BRIEF DESCRIPTION OF THE SEVERAL VIEWS OF THE DRAWING(S)

DETAILED DESCRIPTION

With reference to the Figures, an electronic ballast 1 for stabilizing the current in a gas discharge lamp comprises an elongated bottom plate 2 and a cover 3 which engages the bottom plate 2 with its lower edge, said bottom plate and said cover jointly forming a holder having a sealed off inner space. The cover 3 can be fixed on the bottom plate 2 by means of screws, and said screws can also be used to simultaneously secure the cover 3 in the luminaire for the gas discharge lamp. The holder accommodates the electronic components 11, which are responsible for stabilizing the current through the lamp, the conversion from AC voltage to DC voltage, and the transformation from mains voltage to a higher voltage, if necessary. Only a few electronic components 11 are diagrammatically shown by way of illustration.

Figure 4:
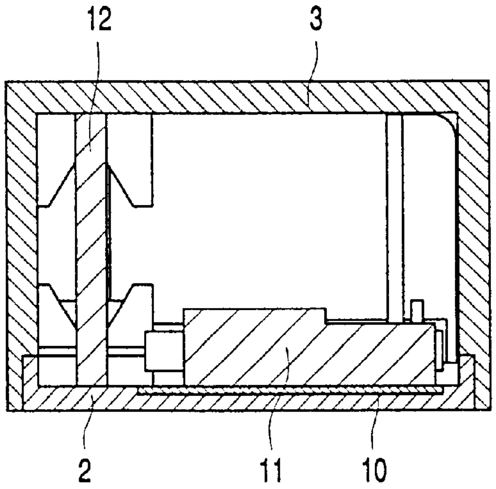
FIG. 4 is a cross-sectional view taken on the line IV—IV in FIG. 2.
Figure 5:
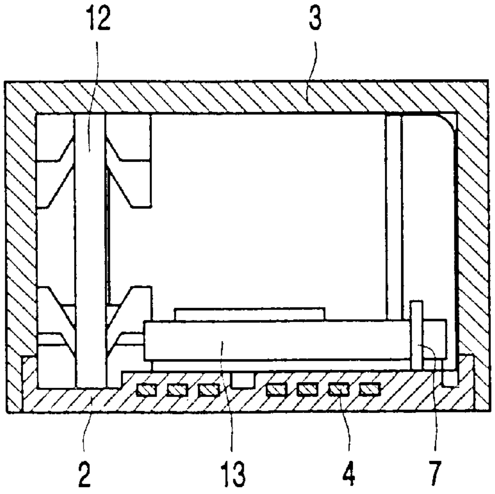
FIG. 5 is a cross-sectional view taken on the line V—V in FIG. 2.
Figure 6:
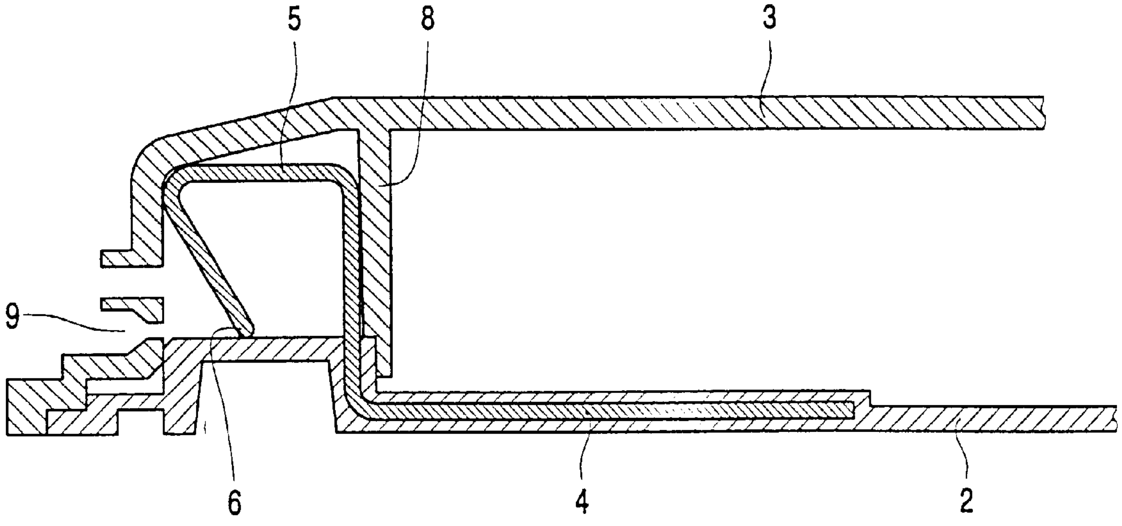
FIG. 6 shows a detail on an enlarged scale of the longitudinal sectional view shown in FIG. 2.

The synthetic resin bottom plate 2 is made by means of injection molding. In this process, a number of metal electroconductive elements 4 are centrally accommodated in the material of the bottom plate, as shown in FIGS. 5 and 6. On the left-hand side of the ballast 1, four such elements 4 are arranged in a side-by side relationship, on the right-hand side, seven such elements are arranged to stabilize one gas discharge lamp or a group of seriesarranged gas discharge lamps. On the left-hand side of the ballast 1, there is enough space to accommodate four more elements 4, which can be used to stabilize a second lamp or a group of series-arranged lamps. In addition, metal plate-shaped cooling elements 10 are accommodated in the bottom plate 2, which, instead of being positioned in the bottom plate 2, are situated at the surface of the bottom plate 2, as shown in FIG. 4.

Figure 1:
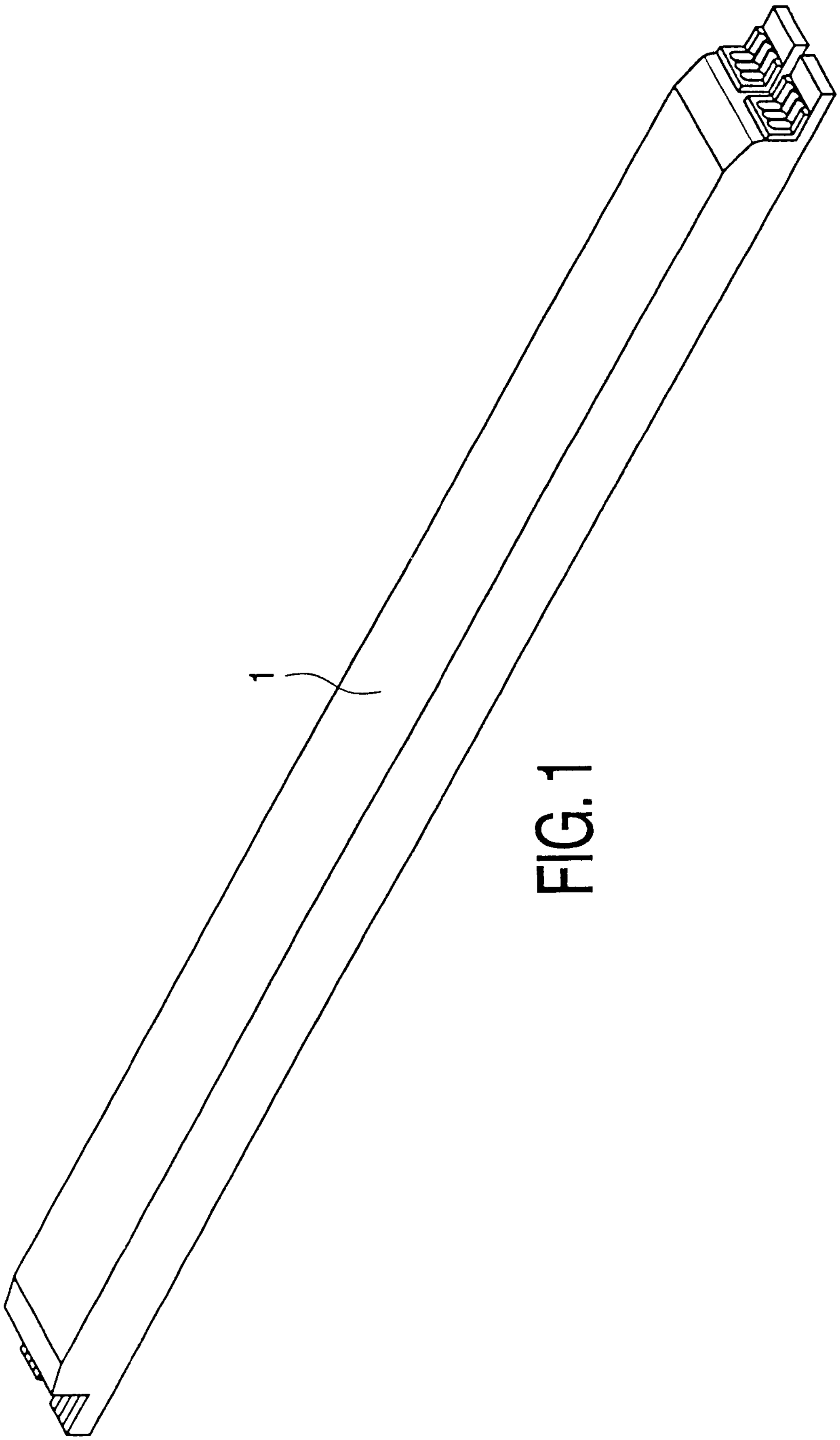
FIG. 1 is a perspective view of an electronic ballast for stabilizing the current in a gas discharge lamp.
Figure 2:
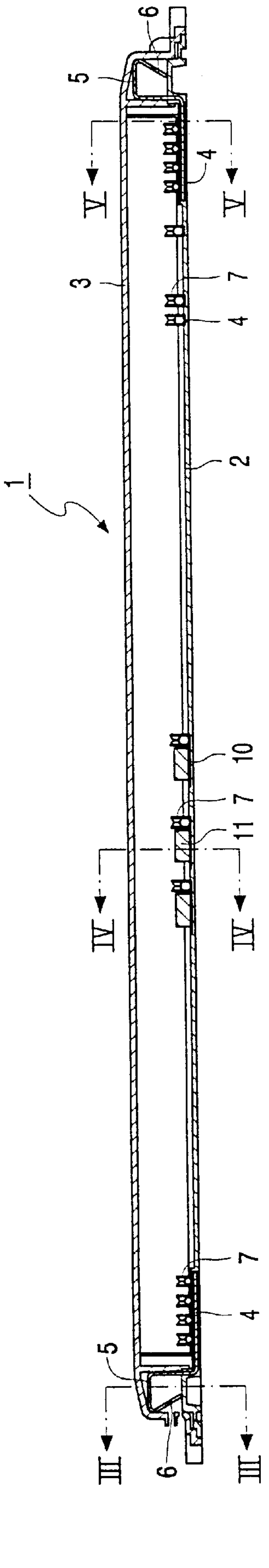
FIG. 2 is a longitudinal sectional view of the ballast shown in FIG. 1.
Figure 3:
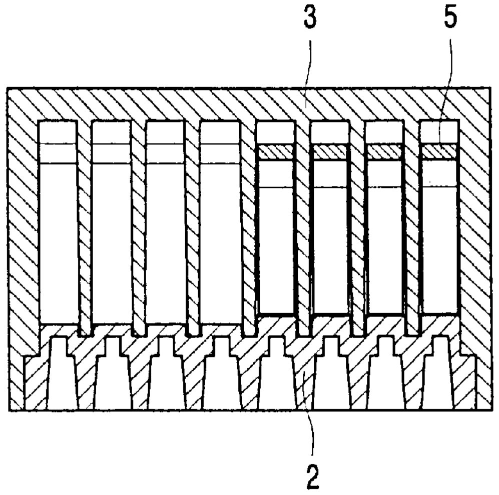
FIG. 3 is a cross-sectional view taken on the line III—III in FIG. 2.

The conductive elements 4 consist of elongated metal strips, which are provided at one end with first, external connectors 5 by means of which the ballast 1 can be connected with the gas discharge lamp. FIG. 6 shows how the elements 4 are accommodated in the bottom plate 2, and it also shows the operation of the external connectors 5. These connectors 5 each comprise a clamping portion 6, which presses against a raised portion of the bottom plate 2 at an oblique angle. If a connection wire (not shown), which is connected to the gas discharge lamp, is passed through the insert opening and pressed against the clamping portion 6, this clamping portion will be lifted by virtue of the oblique angle, thereby enabling the connection wire to be slid underneath the clamping portion 6. If a pulling force is subsequently exerted on the connection wire, this connection wire becomes clamped, also by virtue of the oblique angle, between the clamping portion 6 and the bottom plate 2. The supporting wall 8 and the cover 3 ensure that the clamping portion exerts a sufficiently large pressing force on the bottom plate 2. FIG. 3 shows that the connectors 5 are each situated in a compartment of their own, said compartments being formed by the cover 3, partitions in the cover 3, a supporting wall 8 and a bottom plate 2.

At the other end of the conductive elements 4, there are formed second, internal connectors 7, which may have any shape known in the art. Also the cooling elements 10 are provided with such internal connectors 7. The electronic components 11 are customarily arranged on a printed circuit board 12 whose length and height are substantially equal to the internal dimensions of the ballast 1. The printed circuit board 12 is connected to the internal connectors 7 by means of electrical connection wires 13, as shown in FIG. 5.

As the printed circuit board 12 is perpendicular to the bottom plate, components which generate much heat can rest on the bottom plate 2 during operation, and, if necessary, a molding mass may be provided between said components and the bottom plate, resulting in an improved heat dissipation as compared to a situation in which these components are perpendicular to the bottom plate and surrounded by air. A molding mass is a liquid mass, which is poured onto the bottom plate 2 before the components are placed, and which is subsequently allowed to cure. To prevent the molding mass from leaving the bottom plate 2, said bottom plate is provided with upright edges along its sides. An optimum dissipation of heat is achieved by allowing the components to rest on the metal cooling elements 10. As is well known, metal is a better conductor than synthetic resin. The cooling elements 10 also serve as electromagnetic interference-suppression elements since they are grounded via their connectors 7 and shield the electronic components 11,which are capable of emitting high-frequency signals.

Both the conductive elements 4 and the cooling elements 10 are formed from a metal plate by means of punching. After the punching operation, the connectors 5, 7 are formed by bending the end portions of the elements 4, 10 into the shape shown. Subsequently, the elements 4, 10 are accommodated in the bottom plate 2 in the course of the injection molding process. If necessary, the connectors may alternatively be bent into the right shape after they have been accommodated in the bottom plate. From the moment the elements 4, 10 are being punched from the metal plate up to and including the moment these elements are accommodated in the bottom plate 2, the elements remain in a fixed position with respect to each other, so that the eventual mutual position in the bottom plate 2 corresponds to the original position of the elements 4, 10 relative to each other in the metal plate from which they have been manufactured.

What is claimed is:

1. An electronic ballast for stabilizing the current in a gas discharge lamp, comprising a holder with a wall, electronic components, and at least one electroconductive element disposed to form at least one of:

a connection between individual ones of the electronic components; and a connection between the electronic components and the gas discharge lamp, characterized in that at least a part of the electroconductive element extends parallel to the wall and is enclosed in the material of said wall.

2. An electronic ballast as claimed in claim 1, characterized in that the material of the wall comprises a synthetic resin.

3. An electronic ballast as claimed in claim 1, characterized in that the electroconductive element comprises at least one connector that connects at least one of an electroconductive wire and an electronic component with the electroconductive element.

4. An electronic ballast as claimed in claim 3, characterized in that the connector comprises an elastically deformable clamping portion, which presses against the holder, whereby the electroconductive wire can be clamped between the clamping portion and the holder.

5. An electronic ballast as claimed in claim 4, characterized in that the clamping portion presses against the holder at an acute angle.

6. An electronic ballast as claimed in claim 3, characterized in that the connector extends substantially perpendicularly from the electroconductive element.

7. An electronic ballast as claimed in claim 1, characterized in that the ballast further comprises at least one plate-shaped cooling element disposed one of in and on the wall in which the electroconductive element is enclosed.

8. An electronic ballast as claimed in claim 7, characterized in that the cooling element serves as an electromagnetic shield since it is grounded.

9. An electronic ballast as claimed in claim 1, characterized in that the ballast further comprises a printed circuit board extending substantially perpendicularly with respect to the wall in which the electroconductive element is enclosed.

10. An electronic ballast as claimed in claim 9, characterized in that at least one of the electronic components is in heat-conducting contact, at a location of a part of said electroconductive element that is subject to a substantial increase in temperature during operation, with the wall in which the electroconductive element is enclosed.

11. An electronic ballast as claimed in claim 1, characterized in that the holder comprises a bottom plate, which forms the wall wherein the electroconductive element is enclosed, and a cover which is detachably connected with said bottom plate.

12. A luminaire for a gas discharge lamp, comprising:

a lamp holder, a wall, lamp connectors for connecting a gas discharge lamp, and an electronic ballast for stabilizing the current in the gas discharge lamp, which ballast is connected to at least one of the lamp connectors and comprises electronic components and at least one electroconductive element disposed to form at least one of:

a connection between individual ones of the electronic components; and a connection between the electronic components and the gas discharge lamp, wherein at least a part of the electroconductive element extends parallel to the wall and is enclosed in the material of the wall.

13. A method of manufacturing an electronic ballast for stabilizing the current in a gas discharge lamp, comprising:

disposing electronic components and at least one electroconductive element in a holder with a wall such that the at least one electroconductive element is disposed to form one of a connection between the individual electronic components and a connection between the at least one electronic component and the gas discharge lamp; and enclosing at least a part of the at least one electroconductive element in the material of said wall and parallel to the wall.

14. A method as claimed in claim 13, characterized in that the holder is manufactured by means of injection molding, the electroconductive element being enclosed in the wall in the course of the injection molding process.

15. A method as claimed in claim 13, characterized in that a plurality of electroconductive elements are punched from a plate of metal before they are enclosed in the wall.

16. A method as claimed in claim 15, characterized in that at least one cooling element is simultaneously punched from the plate of metal, which cooling element is provided in or on the wall.

17. A method as claimed in claim 15, characterized in that the electroconductive elements and/or cooling elements are fixed substantially with respect to one another between the time that they are punched and the time that they are enclosed in and/or provided on the wall.

18. A method as claimed in claim 13, characterized in that connectors are formed at the electroconductive element and/or a cooling element by bending parts of the punched plate portions.

* * * * *